US011852657B2

(12) United States Patent
Lin et al.

(10) Patent No.: US 11,852,657 B2
(45) Date of Patent: Dec. 26, 2023

(54) TESTER AND METHOD FOR CALIBRATING PROBE CARD AND DEVICE UNDER TESTING (DUT)

(71) Applicant: Changxin Memory Technologies, Inc., Anhui (CN)

(72) Inventors: You-Hsien Lin, Hefei (CN); Yung-Shiuan Chen, Hefei (CN); Tzu-Chia Liu, Hefei (CN); Hsin-Hsuan Chen, Hefei (CN); Wei Chou Wang, Hefei (CN); Shan Zhang, Hefei (CN); Zhenzheng Jiang, Hefei (CN); Mingxiu Zhong, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 391 days.

(21) Appl. No.: 17/321,248

(22) Filed: May 14, 2021

(65) Prior Publication Data

US 2021/0270868 A1    Sep. 2, 2021

Related U.S. Application Data

(63) Continuation of application No. PCT/CN2019/119528, filed on Nov. 19, 2019.

(30) Foreign Application Priority Data

Nov. 28, 2018  (CN) .......................... 201811433184.5
Nov. 28, 2018  (CN) .......................... 201821974297.1

(51) Int. Cl.
*G01R 1/073*  (2006.01)
*G01R 35/00*  (2006.01)
*G01B 11/27*  (2006.01)

(52) U.S. Cl.
CPC ........ *G01R 1/07342* (2013.01); *G01B 11/272* (2013.01); *G01R 35/005* (2013.01)

(58) Field of Classification Search
CPC ... G01R 1/00; G01R 1/02; G01R 1/06; G01R 1/067; G01R 1/06794; G01R 1/073;
(Continued)

(56) References Cited

U.S. PATENT DOCUMENTS 5,751,157 A    5/1998  Kister
7,119,566 B2  10/2006  Kim
(Continued)

FOREIGN PATENT DOCUMENTS

CN    1639577 A    7/2005
CN  101581733 A   11/2009
(Continued)

OTHER PUBLICATIONS

First Search dated Jun. 22, 2023, issued in related Chinese Application No. 201811433184.5, with English machine translation (5 pages).
(Continued)

*Primary Examiner* — Hoai-An D. Nguyen
(74) *Attorney, Agent, or Firm* — Sheppard Mullin Richter & Hampton LLP

(57) ABSTRACT

A semiconductor tester and a method for calibrating a probe card and a device under testing (DUT) are disclosed. The semiconductor tester includes: a support platform, including a support surface and configured to be able to move along a direction parallel to the support surface and rotate around a rotating shaft perpendicular to the support surface; a probe card including a plurality of probes stretching towards the support platform; and an alignment assembly, including: at least two first laser emitting apparatuses emitting a plurality of first laser beams; and a second laser emitting apparatus emitting a plurality of second laser beams. The first laser beams and the second laser beams are perpendicular to each
(Continued)

other and are each arranged sequentially along a direction perpendicular to the support surface. The semiconductor tester aligns a probe card to a DUT with improved accuracy, thereby preventing the damage to the probe card.

17 Claims, 9 Drawing Sheets

(58) Field of Classification Search
CPC ............ G01R 1/07307; G01R 1/07342; G01R 31/00; G01R 31/28; G01R 31/2851; G01R 31/2886; G01R 31/2891; G01R 35/00; G01R 35/005; G01B 11/00; G01B 11/26; G01B 11/27; G01B 11/272
USPC ...... 324/500, 537, 750.16, 750.23, 600, 601
See application file for complete search history.

(56) References Cited

U.S. PATENT DOCUMENTS

| | | |
|---|---|---|
| 7,538,564 B2 | 5/2009 | Ehrmann et al. |
| 8,130,004 B2 | 3/2012 | Yamada et al. |
| 11,307,246 B2 * | 4/2022 | Lou .................... G01R 31/2887 |
| 2003/0178988 A1 * | 9/2003 | Kim .................... G01R 31/2887 |
| | | 324/750.19 |
| 2007/0159194 A1 | 7/2007 | Hasegawa et al. |
| 2014/0225636 A1 * | 8/2014 | Root ..................... G01R 31/26 |
| | | 324/756.02 |
| 2017/0139003 A1 | 5/2017 | Dengler et al. |
| 2018/0202796 A1 * | 7/2018 | Ziegenbein ........ G01B 9/02021 |

FOREIGN PATENT DOCUMENTS

| | | | |
|---|---|---|---|
| CN | 101611324 A | 12/2009 | |
| CN | 102590566 A | 7/2012 | |
| CN | 103376341 A | 10/2013 | |
| CN | 209311539 U | 8/2019 | |
| JP | 2007311515 A | * 11/2007 | ............. G01N 21/84 |

OTHER PUBLICATIONS

PCT International Search Report and the Written Opinion dated Feb. 7, 2020, issued in related International Application No. PCT/CN2019/119528 (9 pages).

* cited by examiner

TESTER AND METHOD FOR CALIBRATING PROBE CARD AND DEVICE UNDER TESTING (DUT)

CROSS-REFERENCE TO RELATED APPLICATIONS

This application is a continuation application of International Patent Application No. PCT/CN2019/119528, filed on Nov. 19, 2019, which is based on and claims priority of the Chinese Patent Applications No. 201811433184.5 and No. 201821974297.1, both filed on Nov. 28, 2018. The above-referenced applications are incorporated herein by reference in their entirety.

TECHNICAL FIELD

The present invention generally relates to the technical field of semiconductor machining and more specifically, but not by way of limitation, to a semiconductor tester and a method for calibrating a probe card and a device under testing (DUT).

BACKGROUND

Before being packaged into integral chips, wafers need to be tested so that defective wafers are not packaged to reduce the packaging cost. A semiconductor tester may be configured to test the electrical performance of an unpackaged wafer. The semiconductor tester may include a support platform and a probe card. The support platform may be configured to support the wafer, and the probe card is the interface to connect to the wafer. The probe card may include multiple probes, each may be simultaneously and directly contacting with multiple bond pads on the wafer to transmit a corresponding electrical signal. A test instrument on the semiconductor tester may evaluate the electrical performance of the wafer by analyzing the electrical signal.

However, due to extremely small size of the bond pads on the wafer, it is challenging to accurately align the probe card with the bond pads of the wafer after the wafer is placed on the support platform. The alignment typically requires extensive manual work, resulting in low testing efficiency. Additionally, the probes on the probe card are fragile, and any misalignment may result in damages to the probes or the wafer.

It is to be noted that the information disclosed in the above background is merely for facilitating the understanding on the background of the present invention and thus may include information that does not form the prior art known to a person of ordinary skill in the art.

SUMMARY

A series of concepts in a simplified form are introduced in the summary and will be further described in the description of embodiments. This summary is not intended to define key features and essential technical features of the claimed technical solution, nor is it intended as an aid in determining the protection scope of the claimed technical solution.

In view of the limitations of existing technologies described above, the present invention provides a semiconductor tester and a method for calibrating probe card and device under testing (DUT) that overcome at least some of the above-mentioned limitations. The semiconductor tester may include: a support platform, including a support surface and configured to be able to move along a direction parallel to the support surface and rotate around a rotating shaft perpendicular to the support surface; a probe card, disposed above the support platform and configured to be able to move along a direction parallel to the support surface and a direction perpendicular to the support surface, and to rotate around the rotating shaft perpendicular to the support surface. The probe card may include a plurality of probes stretching towards the support platform.

The semiconductor tester may further include an alignment assembly, including: at least two first laser emitting apparatuses each emitting a plurality of first laser beams parallel to the support surface of the support platform and positioned higher than the support surface. The plurality of first laser beams from each of the at least two first laser emitting apparatuses may be arranged sequentially along the direction perpendicular to the support surface. The alignment assembly may further include a second laser emitting apparatus emitting a plurality of second laser beams parallel to the support surface of the support platform and positioned higher than the support surface. The plurality of second laser beams may be arranged sequentially along the direction perpendicular to the support surface, and may be perpendicular to the first laser beams. Each of the at least two first laser emitting apparatuses may be configured to be able to move along a direction parallel to the second laser beams, and the second laser emitting apparatus may be configured to be able to move along a direction parallel to the first laser beams.

In some embodiments of the present invention, the alignment assembly may further include a camera and a third laser emitting apparatus. The camera may be located on a side of the probe card facing away from the support platform and may be configured to be able to move along the direction parallel to the support surface. The third laser emitting apparatus may be installed on the camera. The camera may face towards the support platform, the third laser emitting apparatus may be configured to be able to emit a third laser beam towards the support platform, and the third laser beam may be perpendicular to the support surface.

In some embodiments of the present invention, the probe card may further include a partially or completely transparent probe seat. The plurality of probes may extend from the probe seat and stretch towards the support platform, and at least one of the plurality of probes may be installed on a transparent portion of the probe seat.

In some embodiments of the present invention, the alignment assembly may further include a plurality of first laser receiving apparatuses. The number of the first laser receiving apparatuses may be the same as the number of the first laser emitting apparatuses. Each first laser receiving apparatus may be arranged corresponding to one of the first laser emitting apparatuses, and the first laser emitting apparatuses and the corresponding first laser receiving apparatuses may be respectively located on two sides of the support platform. The first laser emitting apparatuses may be configured to be able to emit the first laser beams to the corresponding first laser receiving apparatuses, and the first laser receiving apparatuses may be configured to be able to receive the first laser beams.

In some embodiments of the present invention, the alignment assembly may further include a second laser receiving apparatus. The second laser receiving apparatus and the second laser emitting apparatus may be respectively disposed on two sides of the support platform. The second laser emitting apparatus may be configured to be able to emit the second laser beams to the second laser receiving apparatus, and the second laser receiving apparatus may be configured to be able to receive the second laser beams.

In some embodiments of the present invention, the semiconductor tester may further include a platform movement mechanism disposed on a bottom of the support platform. The platform movement mechanism may include: a first linear movement mechanism; a second linear movement mechanism, installed on the first linear movement mechanism; and a first rotation movement mechanism, installed on the second linear movement mechanism. The support platform may be installed on the first rotation movement mechanism. The first linear movement mechanism may be configured to be able to drive the second linear movement mechanism to move along the direction parallel to the second laser beams, the second linear movement mechanism may be configured to be able to drive the first rotation movement mechanism to move along the direction parallel to the first laser beams, and the first rotation movement mechanism may be configured to be able to drive the support platform to rotate around the rotating shaft.

In some embodiments of the present invention, the semiconductor tester may further include a probe movement mechanism disposed on the support platform. The probe movement mechanism may include: a third linear movement mechanism; a fourth linear movement mechanism installed on the third linear movement mechanism; an ascending-descending mechanism installed on the fourth linear movement mechanism; and a second rotation movement mechanism, installed on the ascending-descending mechanism. The probe card may be installed on the second rotation movement mechanism. The third linear movement mechanism may be configured to be able to drive the fourth linear movement mechanism to move along the direction parallel to the second laser beams, the fourth linear movement mechanism may be configured to be able to drive the ascending-descending mechanism to move along the direction parallel to the first laser beams, the ascending-descending mechanism may be configured to be able to drive the rotation movement mechanism to be away from or towards the support surface along the direction perpendicular to the support surface, and the second rotation movement mechanism may be configured to be able to drive the probe card to rotate around an axis perpendicular to the support surface.

In some embodiments of the present invention, the alignment assembly may further include a camera movement mechanism disposed on the side of the probe card facing away from the support platform. The camera movement mechanism may include: a fifth linear movement mechanism; and a sixth linear movement mechanism installed on the fifth linear movement mechanism. The camera may be installed on the sixth linear movement mechanism. The fifth linear movement mechanism may be configured to be able to drive the sixth linear movement mechanism to move along the direction parallel to the second laser beams, and the sixth linear movement mechanism may be configured to be able to drive the camera to move along the direction parallel to the first laser beams.

In some embodiments of the present invention, the alignment assembly may further include: a first guide rail having a straight-line shape and parallel to the second laser beams; a plurality of first slide blocks, installed on the first guide rail, and configured to be able to slide along the first guide rail; a second guide rail having a straight-line shape and parallel to the first laser beams; and a plurality of second slide blocks, installed on the second guide rail and configured to be able to slide along the second guide rail. Each of the first laser emitting apparatuses may correspond to one of the first slide blocks and may be disposed on the corresponding first slide block. Each of the second laser emitting apparatuses may correspond to one of the second slide blocks, and may be disposed on the corresponding second slide block.

In some embodiments of the present invention, the alignment assembly may further include: a third guide rail having a straight-line shape and parallel to the first guide rail; and a plurality of third slide blocks, installed on the third guide rail, and configured to be able to slide along the third guide rail. The number of the third slide blocks may be the same as the number of the first laser receiving apparatuses. Each of the third slide blocks may correspond to one of the first laser receiving apparatuses, and each first laser receiving apparatus may be installed on the corresponding third slide block.

In some embodiments of the present invention, the alignment assembly may further include: a plurality of connection frames, each connected to one of the first slide blocks and one of the third slide blocks aligned to the first slide block; and a plurality of seventh linear movement mechanism, each connected with one of the connection frames, and configured to be able to drive the corresponding connection frame to move along a direction parallel to the first guide rail.

In some embodiments of the present invention, the first laser beams and the second laser beams may each have a color different from the color of the third laser beam.

The present invention further provides a method for calibrating a probe card and a device under testing (DUT). The method may include: placing the DUT on a support surface; providing a plurality of first laser arrays and a second laser array between the DUT and the probe card. Each first laser array may include a plurality of first laser beams, the second laser array may include a plurality of second laser beams. The first laser beams and the second laser beams may be perpendicular to each other and be parallel to the support surface. Projections of the plurality of first laser beams in a same first laser array on the support surface may be overlapped, and projections of the plurality of second laser beams on the support surface may be overlapped.

The method may further include aligning two probes on the probe card respectively to two bond pads on the DUT using the first laser beams and the second laser beams as a reference.

In some embodiments of the present invention, in the aforementioned method, aligning two probes on the probe card respectively to two bond pads on the DUT may include: moving the probe card towards the support surface, so that a tip of each of the two probes is located between the first laser beam closest to the support surface and the first laser beam furthest away from the support surface, and is located between the second laser beam closest to the support surface and the second laser beam furthest away from the support surface; moving the first laser arrays and the second laser array, so that the first laser beams furthest away from the support surface in two first laser arrays may be each respectively blocked by one of the two probes, and a second laser beam furthest away from the support surface in the second laser array may be blocked by the two probes; and moving the support surface, so that the two bond pads may be respectively aligned to the first laser beams closest to the support surface in the two first laser arrays, and aligned to the second laser beam closest to the support surface in the second laser array.

In some embodiments of the present invention, the method may further include: providing a third laser beam perpendicular to the support surface; and aligning a center of one of the two probes to a center of one of the two bond pads using the third laser beam as a reference.

In some embodiments of the present invention, aligning the center of one of the two probes to a center of one of the two bond pads may include: aligning the third laser beam to the center of one of the two probes, and recording a position of the probe card; moving away the probe card; and moving the support surface, so that the center of one of the two bond pads is aligned to the third laser beam; and moving the probe card back to the recorded position of the probe card.

In some embodiments of the present invention, the method may further include: moving the probe card towards the support surface; and determining whether the probes contact with the bond pads based on whether the first laser beams are completely blocked by the probes.

As can be seen from the above technical solution, the semiconductor tester and the method for calibrating the probe card and the DUT provided by the present invention have the following advantages and beneficial effects.

In a first step of alignment using the semiconductor tester, two probes on the probe card can be respectively aligned to two bond pads on the DUT using a first laser beam emitted by a first laser emitting apparatus and a second laser beam emitted by a second laser emitting apparatus as reference, so the accuracy of the alignment between the probe card and the DUT can be improved, and the manual manipulation of the probe card can be reduced or eliminated, thereby preventing the damage to the probe card.

BRIEF DESCRIPTION OF THE DRAWINGS

In combination with the accompanying drawings and with the consideration of the detailed description on embodiments of the present invention, various objectives, characteristics and advantages of the present invention will become more apparent. The accompanying drawings are exemplary representations of the present invention and are unnecessarily drawn proportionally. In the accompanying drawings, identical numerals represent identical or similar components all the time.

DETAIL DESCRIPTION OF THE EMBODIMENTS

Figure 1:
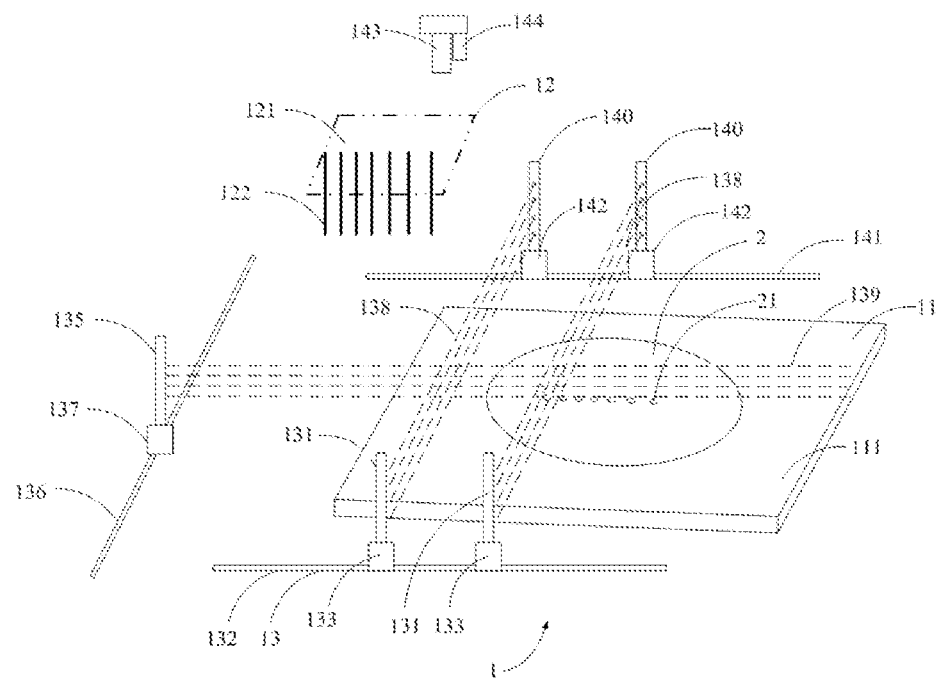
FIG. 1 is a structural schematic diagram of a semiconductor tester in accordance with one embodiment of the present invention.

The exemplary embodiments will be described more completely with reference to the accompanying drawings. However, the exemplary embodiments can be implemented in various forms, and should not be understood as being limited to the embodiments described herein. Instead, these embodiments are provided to make the present invention thorough and complete, and fully convey the concepts of the exemplary embodiments to a person skilled in the art. Identical numerals in the drawings represent an identical or similar structure and thus the detailed descriptions thereof are omitted.

Referring to FIG. 1, the structure of a semiconductor tester 1 in an embodiment is shown. The semiconductor tester 1 may be configured to test the electrical performance of a DUT 2. The DUT 2 may be a wafer or a chip. Multiple bond pads 21 may be disposed on the DUT 2. The semiconductor tester 1 may include a support platform 11, a platform movement mechanism 15 (referring to FIG. 2), a probe card 12, a probe movement mechanism 16 (referring FIG. 3) and an alignment assembly 13.

The support platform 11 may be a square platform or a circular platform. The support platform 11 may include a support surface 111. The support surface 111 may be disposed on a top of the support platform 11. The support surface 111 may be a plane, and may be configured to support the DUT 2. The support surface 111 may be disposed horizontally. When the DUT 2 is placed on the support surface 111, the bond pads 21 of the DUT 2 may face upwards.

The alignment assembly 13 may include the first guide rail 132, the second guide rail 136, a plurality of first slide blocks 133, the second slide block 137, the first laser emitting apparatus 131, and the second laser emitting apparatus 135. The first guide rail 132 and the second guide rail 136 may both have a straight-line shape. The first guide rail 132 may be disposed on a side of the support platform 11, and the second guide rail 136 may be disposed on a side of the support platform 11 adjacent to the first laser emitting apparatuses 131. The first guide rail 132 and the second guide rail 136 may both be parallel to the support surface 111. The first guide rail 132 and the second guide rail 136 may be perpendicular to each other. The plurality of first slide blocks 133 may be disposed on the first guide rail 132 and may be configured to be able to slide along the first guide rail 132. The second slide block 137 may be disposed on the second guide rail 136 and may be configured to be able to slide along the second guide rail 136.

At least two first laser emitting apparatuses 131 may be provided. The number of the first slide blocks 133 may be the same as the number of the first laser emitting apparatuses 131. Each of the first laser emitting apparatuses 131 may correspond to one of the first slide blocks 133, and may be disposed on the corresponding first slide block 133. Since the first slide blocks 133 are configured to be able to slide along the first guide rail 132, each of the at least two first laser emitting apparatuses 131 can also move along with the corresponding first guide rail 132 to adjust a space between the at least two first laser emitting apparatuses 131. The second laser emitting apparatus 135 may be installed on the second slide block 137, and may be configured to be able to move along the second guide rail 136.

Each of the first laser emitting apparatuses 131 and the second laser emitting apparatus 135 may emit a plurality of laser emitters (not shown) sequentially arranged along a direction perpendicular to the support surface 111. Each laser emitter may emit a laser beam. The first laser emitting apparatuses 131 may emit a plurality of first laser beams 138 along a direction towards the support platform 11. The first laser beams 138 may be parallel to the support surface 111. The plurality of first laser beams 138 emitted by each first laser emitting apparatus 131 may be sequentially arranged in a direction perpendicular to the support surface 111. Orthographic projections of the plurality of first laser beams 138 emitted by a same first laser emitting apparatus 131 on the support platform 11 may be overlapped together. The first laser beams 138 may be parallel to the second guide rail 136. The second laser emitting apparatus 135 may emit a plurality of second laser beams 139 along a direction towards the support platform 11. The second laser beams 139 may be parallel to the support surface 111. The second laser beams 139 may be perpendicular to the first laser beams 138 and may be parallel to the first guide rail 132. The plurality of second laser beams 139 emitted by the second laser emitting apparatus 135 may be sequentially arranged in the direction perpendicular to the support surface 111. Orthographic projections of the plurality of second laser beams 139 emitted by the second laser emitting apparatus 135 on the support platform 11 may be overlapped together. The first laser beams 138 and the second laser beams 139 may be positioned higher than the support surface 111. That is, the first laser beams 138 and the second laser beams 139 may pass over the support platform 11.

The two first laser emitting apparatuses 131 may be respectively disposed on two first slide blocks 133. A space between first laser beams 138 from two first laser emitting apparatuses 131 may be adjusted by adjusting a distance between the two first laser emitting apparatuses 131, so as to adapt for different specifications of the bond pads 21, different spaces between the bond pads 21 on the DUT 2, and different sizes of the probe cards 12.

Figure 2:
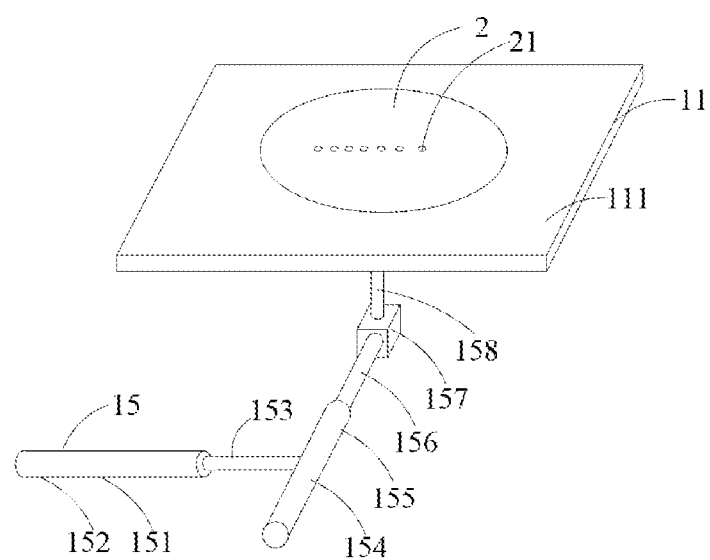
FIG. 2 is a schematic diagram of a platform movement mechanism in accordance with one embodiment of the present invention.

Referring to FIG. 2, the platform movement mechanism 15 may be disposed on a bottom of the support platform 11. The platform movement mechanism 15 may be configured to be able to drive the support platform 11 to move in a direction parallel to the support surface 111 and to rotate around a rotating shaft perpendicular to the support surface 111. The platform movement mechanism 15 may include a first linear movement mechanism 151, a second linear movement mechanism 154 and a first rotation movement mechanism 157. The support platform 11 may be disposed on the first rotation movement mechanism 157. The first rotation movement mechanism 157 may be configured to be able to drive the support platform 11 to rotate around the rotating shaft perpendicular to the support surface 111. The first rotation movement mechanism 157 may include an electric motor. A spindle 158 of the electric motor may be perpendicular to the support surface 111, and may be connected to the bottom of the support platform 11. The rotation of the spindle 158 of the electric motor may drive the support platform 11 to rotate around the rotating shaft perpendicular to the support surface 111.

The first rotation movement mechanism 157 may be installed on the second linear movement mechanism 154. The second linear movement mechanism 154 may be configured to be able to drive the first rotation movement mechanism 157 to move along a direction parallel to the first laser beams 138. The second linear movement mechanism 154 may be mounted on the first linear movement mechanism 151. The first linear movement mechanism 151 may be configured to be able to drive the second linear movement mechanism 154 to move along a direction parallel to the second laser beams 139.

In some embodiments, the first linear movement mechanism 151 and the second linear movement mechanism 154 may both include an electric cylinder. The first linear movement mechanism 151 may include a first cylinder body 152 and a first telescopic rod 153, and the first telescopic rod 153 may retract into or stretch out of the first cylinder body 152. The second linear movement mechanism 154 may include a second cylinder body 155 and a second telescopic rod 156, and the second telescopic rod 156 may retract into or stretch out of the second cylinder body 155.

The second cylinder body 155 may be installed on the first telescopic rod 153. The direction in which the first telescopic rod 153 retracts into or stretches out of the first cylinder body 152 may be parallel to the second laser beams 139. The first rotation movement mechanism 157 may be installed on the second telescopic rod 156. The direction in which the second telescopic rod 156 retracts into or stretches out of the second cylinder body 155 may be parallel to the first laser beams 138.

By stretching and retracting the first telescopic rod 153, the second cylinder body 155 may be driven to move along the direction parallel to the second laser beams 139, and thus the support platform 11 may be driven to move along the direction parallel to the second laser beams 139. By stretching and retracting the second telescopic rod 156, the first rotation movement mechanism 157 may be driven to move along the direction parallel to the first laser beams 138, and thus the support platform 11 may be driven to move along the direction parallel to the first laser beams 138.

Figure 3:
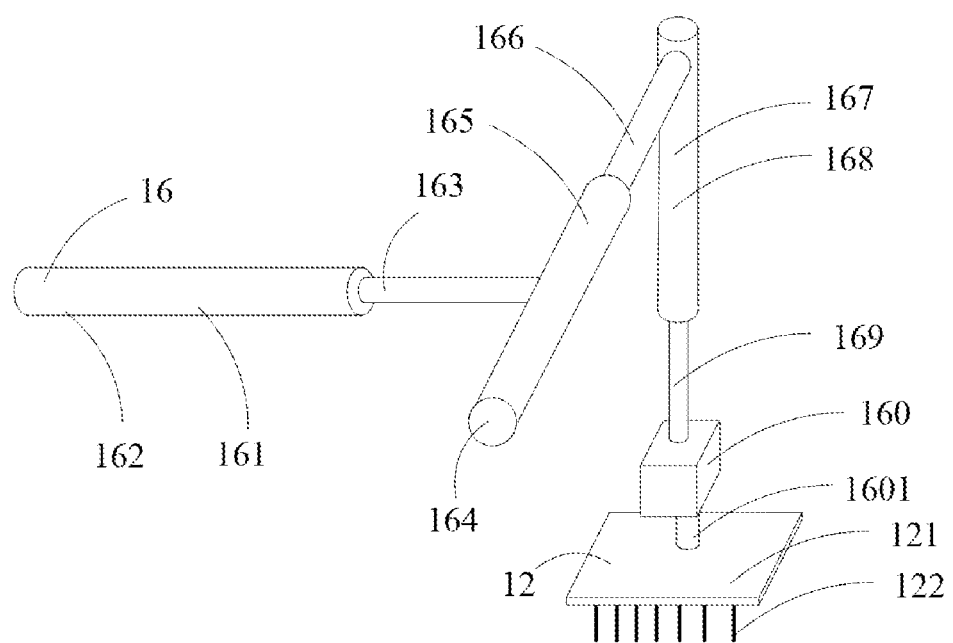
FIG. 3 is a schematic diagram of a probe movement mechanism in accordance with one embodiment of the present invention.

Referring to FIG. 3, the probe card 12 may be an interface provided by the semiconductor tester 1 to connect the DUT 2. The probe card 12 may be disposed above the support platform 11. The probe card 12 may include a probe seat 121 and a plurality of probes 122. The probe seat 121 may be a flat plate and may be parallel to the support surface 111. The probe seat 121 may be a printed circuit board (PCB board). The plurality of probes 122 may stretch out of the probe seat 121 towards the support platform 11. The plurality of probes 122 may be perpendicular to the support surface 111 of the support platform 11. One or more probes 122 may contact the bond pads 21 of the DUT 2 to receive an electrical signal from the DUT 2. A diameter of each of the first laser beams 138 and the second laser beams 139 may be smaller than a diameter of each probe 122.

Each of the probes 122 on the probe card 12 may correspond to one of the bond pads 21 on the DUT 2. During a test, a tip of each probe 122 may contact the corresponding bond pad 21. When the plurality of bond pads 21 are arranged in a row on the DUT 2, the plurality of probes 122 may also be arranged in a row on the probe card 12.

The probe movement mechanism 16 may be disposed on the support platform 11. The probe movement mechanism 16 may include a third linear movement mechanism 161, a fourth linear movement mechanism 164, an ascending-descending mechanism 167 and a second rotation movement mechanism 160. The probe card 12 may be installed on the second rotation movement mechanism 160 and may be located under the second rotation movement mechanism 160. The second rotation movement mechanism 160 may be configured to be able to drive the probe card 12 to rotate around an axis perpendicular to the support surface 111. The second rotation movement mechanism 160 may include an electric motor. A spindle of the electric motor may be perpendicular to the support surface 111, and may stretch towards the support platform 11. The probe seat 121 of the probe card 12 may be installed on the spindle 1601. The probe seat 121 may be perpendicular to the spindle 1601. With the rotation of the spindle 1601 of the electric motor, the probe card 12 may be driven to rotate around the axis perpendicular to the support surface 111.

The second rotation movement mechanism 160 may be installed on the ascending-descending mechanism 167. The ascending-descending mechanism 167 may be configured to be able to drive the second rotation movement mechanism 160 to move away from or towards the support surface 111 along the direction perpendicular to the support surface 111. The ascending-descending mechanism 167 may be installed on the fourth linear movement mechanism 164. The fourth linear movement mechanism 164 may be configured to be able to drive the ascending-descending mechanism 167 to move along the direction parallel to the first laser beams 138. The fourth linear movement mechanism 164 may be installed on the third linear movement mechanism 161. The third linear movement mechanism 161 may be configured to be able to drive the fourth linear movement mechanism 164 to move along the direction parallel to the second laser beams 139.

In some embodiments, the third linear movement mechanism 161, the fourth linear movement mechanism 164 and the ascending-descending mechanism 167 may each include an electric cylinder. The third linear movement mechanism 161 may include a third cylinder body 162 and a third telescopic rod 163, and the third telescopic rod 163 may retract into or stretch out of the third cylinder body 162. The fourth linear movement mechanism 164 may include a fourth cylinder body 165 and a fourth telescopic rod 166, and the fourth telescopic rod 166 may retract into or stretch out of the fourth cylinder body 165. The ascending-descending mechanism 167 may include an eighth cylinder body 168 and an eighth telescopic rod 169, and the eighth telescopic rod 169 may retract into or stretch out of the eighth cylinder body 168.

The fourth cylinder body 165 may be installed on the third telescopic rod 163. The direction in which the third telescopic rod 163 retracts into or stretches out of the third cylinder body 162 may be parallel to the second laser beams 139. The eighth cylinder body 168 may be installed on the fourth telescopic rod 166. The direction in which the fourth telescopic rod 166 retracts into or stretches out of the fourth cylinder body 165 may be parallel to the first laser beams 138. The second rotation movement mechanism 160 may be installed on the eighth telescopic rod 169. The direction in which the eighth telescopic rod 169 retracts into or stretches out of the eighth cylinder body 168 may be perpendicular to the support surface 111.

By stretching and retracting the third telescopic rod 163, the fourth cylinder body 165 may be driven to move along the direction parallel to the second laser beams 139, and thus the probe card 12 may be driven to move along the direction parallel to the second laser beams 139. By stretching and retracting the fourth telescopic rod 166, the eighth cylinder body 168 may be driven to move along the direction parallel to the first laser beams 138, and thus the probe card 12 may be driven to move along the direction parallel to the first laser beams 138. By stretching and retracting the eighth telescopic rod 169, the second rotation movement mechanism 160 may be driven to move away from or towards the support surface 111 along the direction perpendicular to the support surface 111, and thus the probe card 12 may be driven to move away from or towards the support surface 111 along the direction perpendicular to the support surface 111.

Figure 4:
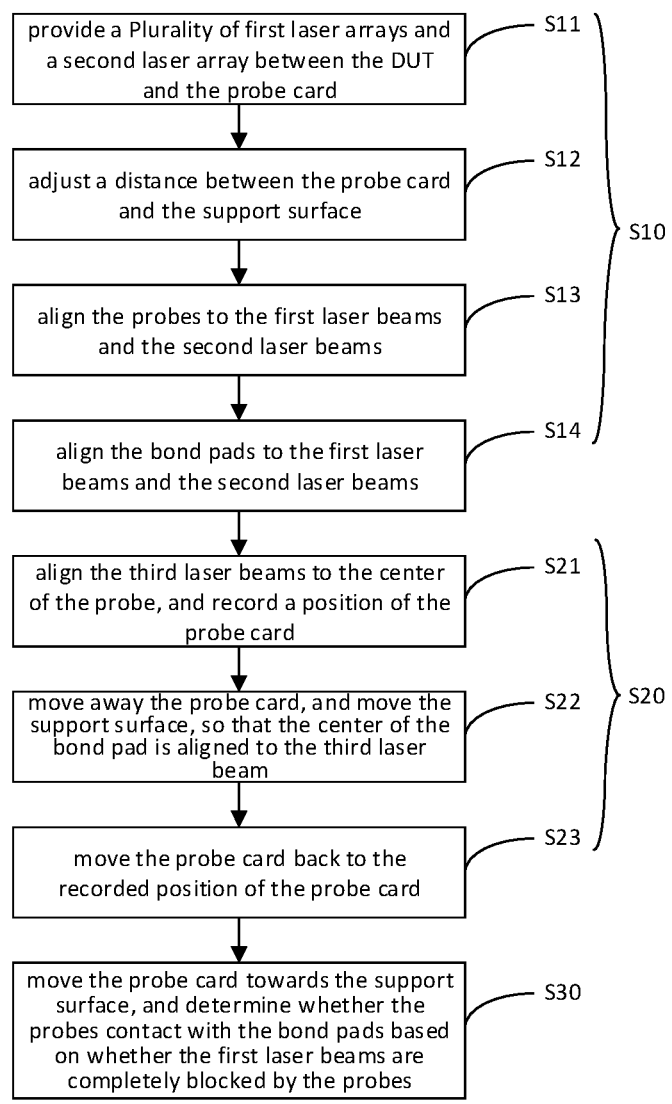
FIG. 4 is a flowchart illustrating a method for calibrating a probe card and a DUT in accordance with one embodiment of the present invention.

Referring to FIG. 4, the present invention further provides a method for calibrating a probe card 12 and a DUT 2. Before a semiconductor tester 1 is used to test the DUT 2, this method may be used to align the probe card 12 to the DUT 2. This method may include the following steps.

In step S10, two probes on the probe card may be respectively aligned to two bond pads on the DUT using the first laser beams and second laser beams as a reference.

Step S10 may include steps S11-S14.

In step S11, a plurality of first laser arrays and a second laser array may be provided between the DUT and the probe card.

The DUT 2 may be placed on a support surface 111, and a plurality of first laser arrays and a second laser array may be provided between the DUT 2 and the probe card 12. Each first laser array may include a plurality of first laser beams 138, and the second laser array may include a plurality of second laser beams 139. The first laser beams 138 and the second laser beams 139 may be perpendicular to each other and may both be parallel to the support surface 111. Projections of the plurality of first laser beams 138 in a same first laser array on the support surface 111 may be overlapped, and projections of the plurality of second laser beams 139 on the support surface 111 may be overlapped.

Referring to FIG. 1, the DUT 2 may first be placed on the support platform 11, with a side of the DUT 2 with bond pads 21 facing upwards. Then a plurality of first laser emitting apparatuses 131 and a second laser emitting apparatus 135 may be turned on. Each of the first laser emitting apparatuses 131 may emit a plurality of first laser beams 138, all the first laser beams 138 emitted by one first laser emitting apparatuses 131 may form one first laser array, the second laser emitting apparatus 135 may emit a plurality of second laser beams 139, and all second laser beams 139 emitted by the second laser emitting apparatus 135 may form one second laser array. The first laser beams 138 and the second laser beams 139 may be located between the DUT 2 and the probe card 12.

In step S12, a distance between the probe card and the support surface may be adjusted.

The probe card 12 may be moved towards the support surface 111, so that a tip of each probe 12 may be located between the first laser beam 138 closest to the support surface 111 and the first laser beam 138 furthest away from the support surface 111, and may be located between the second laser beam 139 closest to the support surface 111 and the second laser beam 139 furthest away from the support surface 111.

Figure 5:
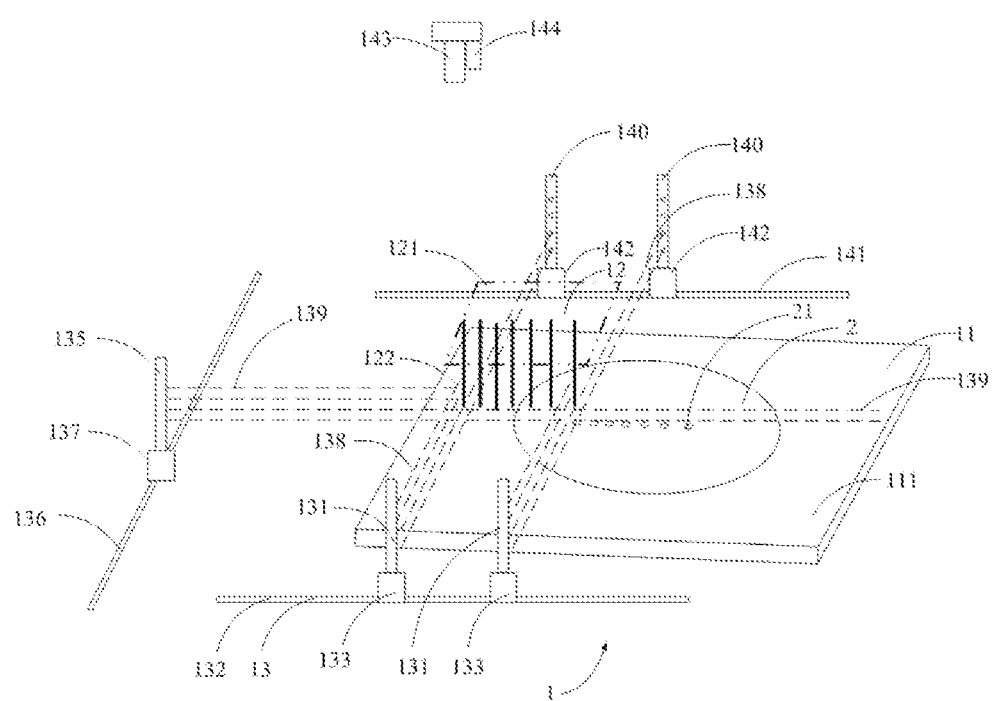
FIG. 5 is a schematic diagram of a semiconductor tester in a state that a laser beam is aligned to a probe in a first step of alignment in accordance with one embodiment of the present invention.

Referring to FIG. 5, a probe movement mechanism 16 may drive the probe card 12 to move towards the support surface 111, till the tip of each probe 122 is higher than the bottommost first laser beam 138 and the bottommost second laser beam 139 and lower than the topmost first laser beam 138 and the topmost second laser beam 139.

In step S13, the probes may be aligned to the first laser beams and the second laser beams.

The plurality of first laser arrays, the second laser array and the probe card 12 may be moved, so that the first laser beams 138 furthest away from the support surface 111 in two first laser arrays are each respectively blocked by one of two probes 122, and a second laser beam 139 furthest away from the support surface 111 in the second laser array may be blocked by two probes 122.

Referring to FIG. 5, positions of the probe card 12, the first laser emitting apparatuses 131 and the second laser emitting apparatus 135 may be adjusted, so that the topmost first laser beams 138 respectively emitted by two first laser emitting apparatuses 131 may be each respectively blocked by one of two probes 122, and the topmost second laser beam 139 emitted by the second laser emitting apparatus 135 is blocked by one of the two probes 122, and the tip of the other probe 122 is level to the bottommost second laser beam 139.

In step S14, the bond pads may be aligned to the first laser beams and the second laser beams.

The support surface 111 may be moved, so that the two bond pads 21 are respectively aligned to the first laser beams 138 closest to the support surface 111 in the two first laser arrays, and aligned to the second laser beam 139 closest to the support surface in the second laser array.

Figure 6:
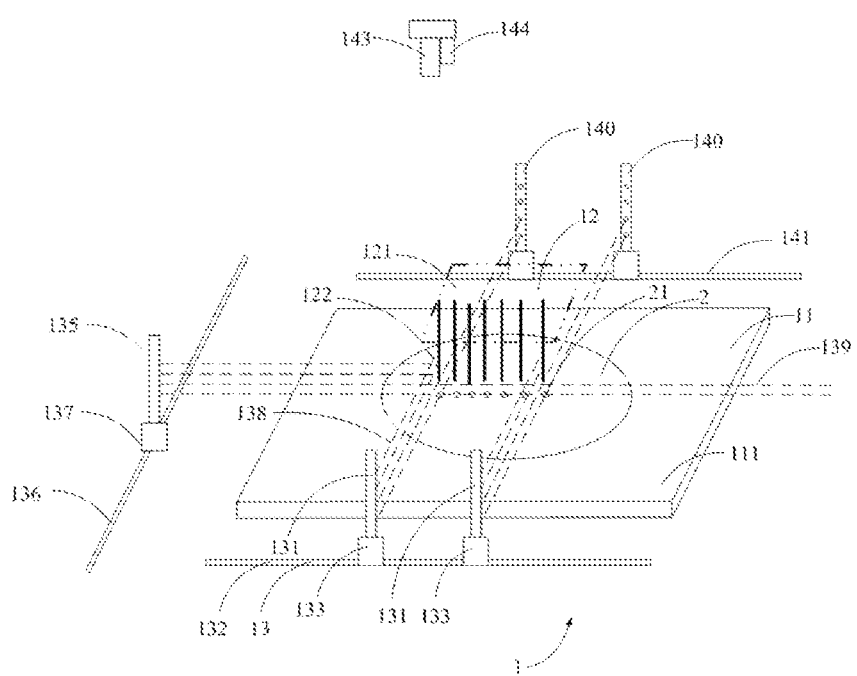
FIG. 6 is a schematic diagram of a semiconductor tester in a state that a laser beam is aligned to a bond pad in a first step of alignment in accordance with one embodiment of the present invention.

Referring to FIG. 6, the support platform 11 may be moved, so that two bond pads 21 corresponding to the two probes 122 on the DUT 2 may be respectively aligned to the bottommost first laser beams 138 emitted by the two first laser emitting apparatuses 131, and the two bond pads 21 may be further aligned to the bottommost second laser beam 139.

Figure 7:
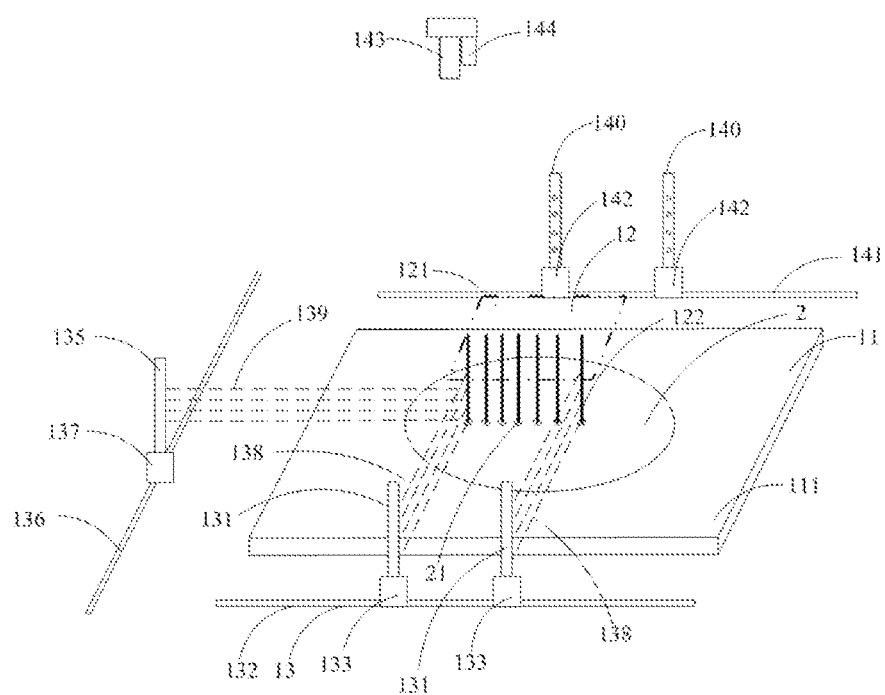
FIG. 7 is a schematic diagram of a semiconductor tester in a state that a probe contacts with a bond pad upon the completion of a first step of alignment in accordance with one embodiment of the present invention.

That completes the first step of alignment between the probe card 12 and the DUT 2. Referring to FIG. 7, upon the completion of the first step of alignment, the probes 122 may be moved towards the support surface 111 so that the tip of each probe 122 to be abutted against the corresponding bond pad 21. That improves the accuracy of the alignment.

Further, the probe seat 121 of the probe card 12 may be set as being completely transparent or partially transparent. At least one probe 122 may be installed on a transparent portion of the probe seat 121. The alignment assembly 13 may further include a camera 143, a third laser emitting apparatus 144 and a camera movement mechanism 17. The camera 143, the third laser emitting apparatus 144 and the camera movement mechanism 17 may be disposed on a side of the probe card 12 facing away from the support platform 11. The third laser emitting apparatus 144 may be installed on the camera 143. The third laser emitting apparatus 144 may emit a third laser beam 145 towards the support platform, and the third laser beam 145 may be perpendicular to the support surface. The camera 143 may face towards the support platform. An image photographed by the camera 143 may be played in real time via an external display. The image photographed by the camera 143 may be an enlarged image preferably. The camera 143 may be a charge coupled device (CCD) camera.

Figure 8:
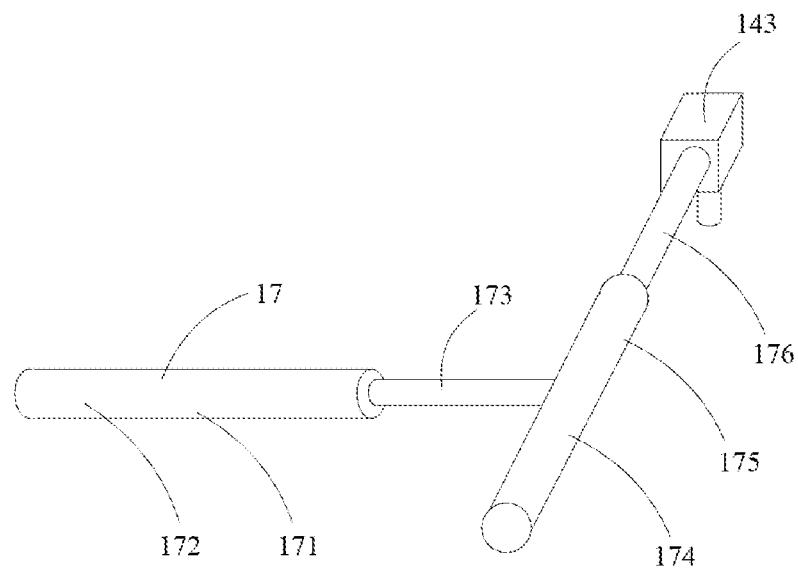
FIG. 8 is a structural schematic diagram of a camera movement mechanism in accordance with one embodiment of the present invention.

Referring to FIG. 8, the camera 143 may be installed on the camera movement mechanism 17, and the camera movement mechanism 17 may be configured to be able to drive the camera to move along the direction parallel to the support surface 111. The camera movement mechanism 17 may include a fifth linear movement mechanism 171 and a sixth linear movement mechanism 174. The sixth linear movement mechanism 174 may be installed on the fifth linear movement mechanism 171. The camera 143 may be installed on the sixth linear movement mechanism 174.

The fifth linear movement mechanism 171 may be configured to be able to drive the sixth linear movement mechanism 174 to move along the direction parallel to the second laser beams 139, and the sixth linear movement mechanism 174 may be configured to be able to drive the camera 143 and the third laser emitting apparatus 144 to move along the direction parallel to the first laser beams 138.

The fifth linear movement mechanism 171 and the sixth linear movement mechanism 174 may both include an electric cylinder. The fifth linear movement mechanism 171 may include a fifth cylinder body 172 and a fifth telescopic rod 173, and the fifth telescopic rod 173 may retract into or stretch out of the fifth cylinder body 172. The sixth linear movement mechanism 174 may include a sixth cylinder body 175 and a sixth telescopic rod 176, and the sixth telescopic rod 176 may retract into or stretch out of the sixth cylinder body 175.

The sixth cylinder body 175 may be installed on the fifth telescopic rod 173. The direction in which the fifth telescopic rod 173 retracts into or stretches out of the fifth cylinder body 172 may be parallel to the second laser beams 139. The camera 143 may be installed on the sixth telescopic rod 176. The direction in which the sixth telescopic rod 176 retracts into or stretches out of the sixth cylinder body 175 may be parallel to the first laser beams 138.

By stretching and retracting the fifth telescopic rod 173, the sixth cylinder body 175 may be driven to move along the direction parallel to the second laser beams 139, and thus the camera 143 and the third laser emitting apparatus 144 may be driven to move along the direction parallel to the second laser beams 139. By stretching and retracting the sixth telescopic rod 176, the camera 143 and the third laser emitting apparatus 144 may be driven to move along the direction parallel to the first laser beams 138.

After the probe card 12 is aligned with the DUT 2 by the steps described above (i.e., after the first step of alignment), a second step of alignment may be performed so that the probe card 12 and the DUT 2 may be more accurately aligned. That is, the probes 122 on the probe card 12 may be aligned with centers of the corresponding bond pads 21 on the DUT 2.

The method for further aligning the probe card 12 and the DUT 2 may include step S20.

In step S20, a third laser beam 145 perpendicular to the support surface 111 may be provided, and a center of one probe 122 may be aligned to a center of one bond pad 21 using the third laser beam 145 as a reference. The step S20 may include steps S21-S22.

In step S21, the third laser beam may be aligned to the center of the probe, and a position of the probe card may be recorded.

Figure 9:
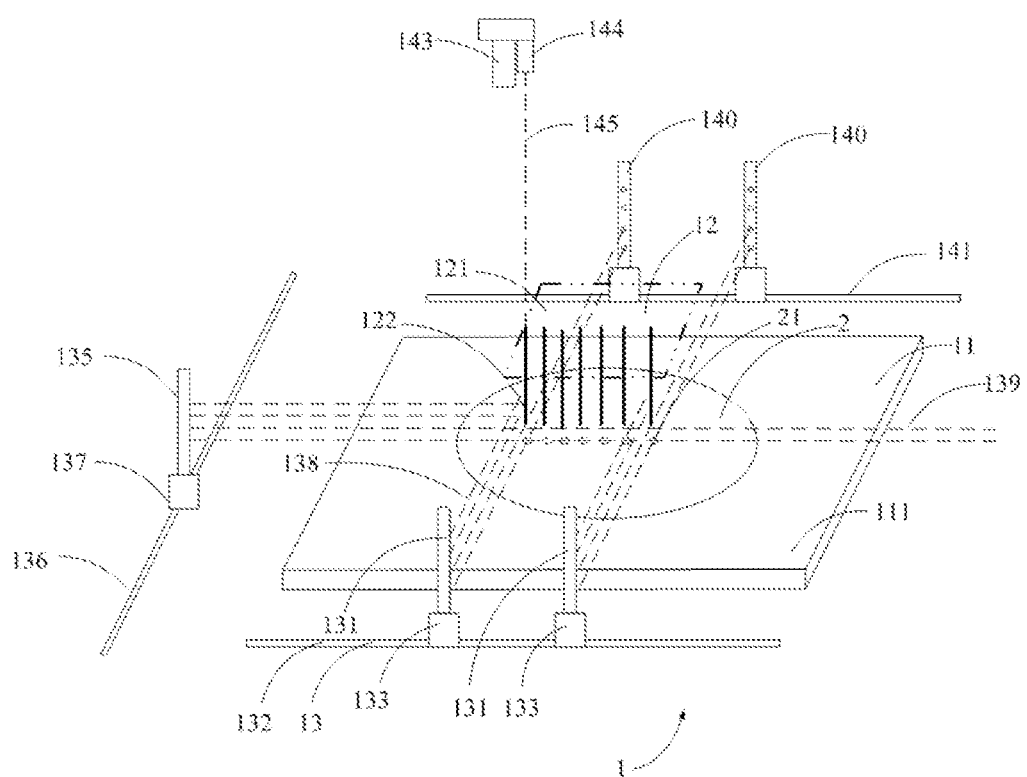
FIG. 9 is a schematic diagram of a semiconductor tester in a state that a center of a probe is aligned to a third laser beam in a second step of alignment in accordance with one embodiment of the present invention.

Referring to FIG. 9, after the first step of alignment, the position of the probe card 12 may be recorded. Then the third laser emitting apparatus 144 may be turned on, and the third laser emitting apparatus 144 may emit the third laser beam 145 towards the support surface 111. With reference to the image photographed by the camera 143, positions of the camera 143 and the third laser emitting apparatus 144 may be adjusted via the camera movement mechanism 17, so that the third laser beam 145 emitted by the third laser emitting apparatus 144 is aligned to the center of one probe 122. In this embodiment, as the probe seat 121 of the probe card 12 is set as being completely transparent or partially transparent, and the probe 122 is disposed on the transparent portion of the probe seat 121, the third laser beam 145 may be aligned to the probe 122.

In step S22, the probe card may be moved away, and the support surface may be moved, so that the center of the bond pad 21 is aligned to the third laser beam.

Figure 10:
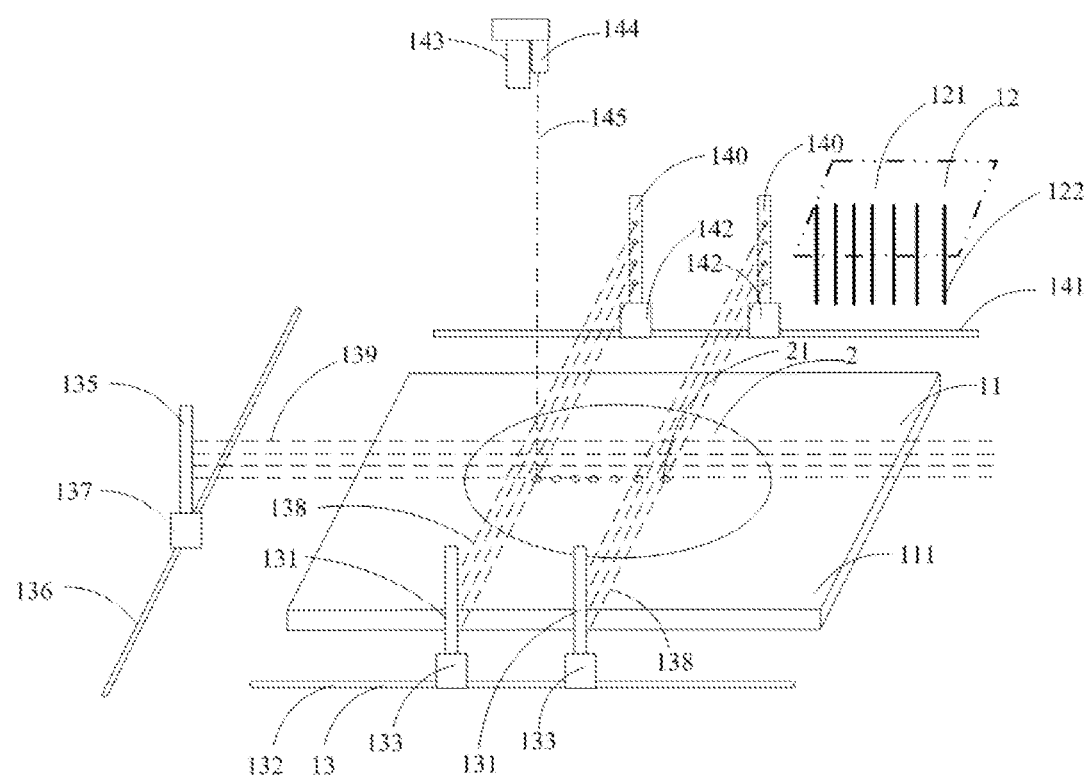
FIG. 10 is a schematic diagram of a semiconductor tester in a state that a center of a bond pad is aligned to a third laser beam in a second step of alignment in accordance with one embodiment of the present invention.

After the third laser beam 145 is aligned to the center of the probe 122, the probe card 12 may be moved away through the probe movement mechanism 16, so that the third laser beam 145 may reach the DUT 2. Referring to FIG. 10, with reference to the image photographed by the camera 143, the platform movement mechanism 15 may move the support platform 11, so that a center of one bond pad 21 corresponding to the probe 122 on the DUT 2 may be aligned to the third laser beam 145.

In step S23, the probe card may be moved back to the recorded position.

The probe card 12 may be moved back to the position after the completion of the first step of alignment. That completes the second step of alignment between the probe card 12 and the DUT 2.

Figure 11:
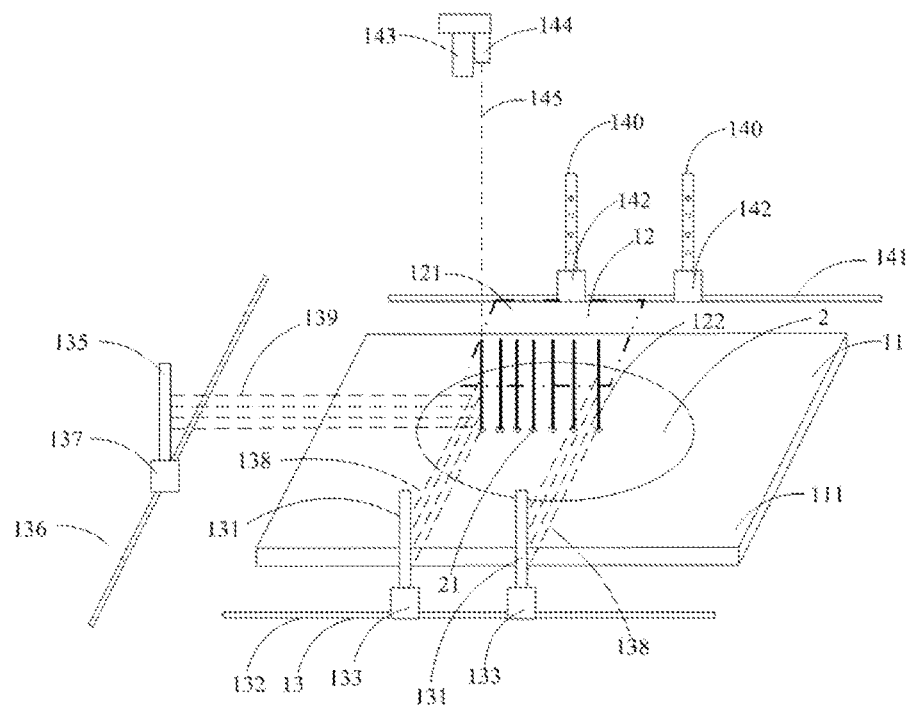
FIG. 11 is a schematic diagram of a semiconductor tester in a state that a probe contacts with a bond pad upon the completion of a second step of alignment in accordance with one embodiment of the present invention.

In the second step of alignment, as the third laser emitting apparatus 144 is positioned closely adjacent to the camera 143, therefore by observing from the perspective of a lens of the camera 143, the third laser beam 145 may be accurately aligned to the center of the probe 122 or to the center of the bond pad 21. Thus, the accuracy of the alignment between the probe 122 and the bond pad 21 can be improved. Upon the completion of the second step of alignment, the tip of the probe 122 may be aligned to the center of the bond pad 21 of the DUT 2. Referring to FIG. 11, the probe card 12 may be further moved towards the support surface 111, the tips of the probes 122 on the probe card 12 may contact with centers of the corresponding bond pads 21, so the time for manual manipulation of the probe card 12 may be reduced or eliminated, the accuracy of alignment between the probe card 12 and the DUT 2 may be improved, thereby preventing the damage to the probe card 12.

The first laser beams 138, the second laser beams 139 and the third laser beam 145 may have a same color. For example, they may all be red, blue or green.

The first laser beams 138 and the second laser beams 139 may also have a color different from the color of the third laser beam 145. For example, the first laser beams 138 and the second laser beams 139 may be blue, and the third laser beam 145 may be red. With the first laser beams 138 and the second laser beams 139 having a color different with the color of the third laser beam 145, the third laser beam 145 may be more easily distinguished from the first laser beams 138 and the second laser beams 139.

The colors of the first laser beams 138, the second laser beams 139 and the third laser beam 145 may be different from each other. For example, the first laser beams 138 may be green, the second laser beams 139 may be blue, and the third laser beam 145 may be red. With each of the three types of laser beams having a unique color, these laser beams may be more easily distinguished from each other.

Figure 12:
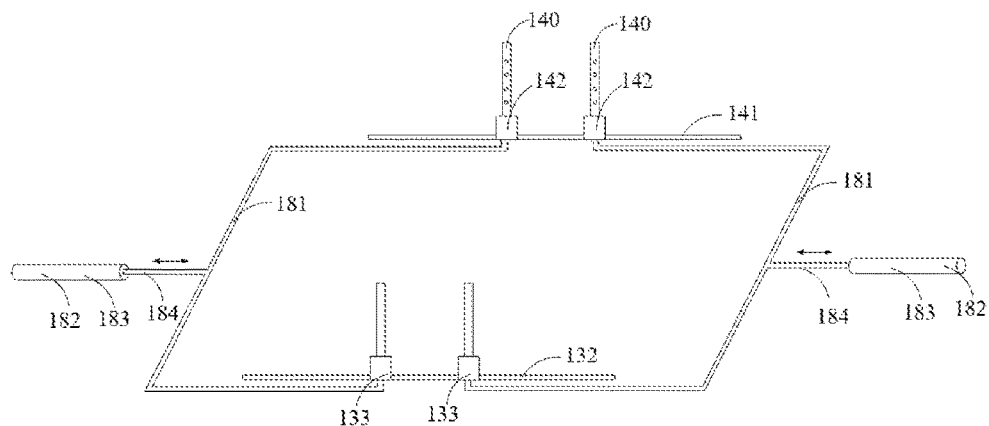
FIG. 12 is a structural schematic diagram of connection frames and seventh linear movement mechanisms in accordance with one embodiment of the present invention.

Further, referring to FIG. 12, the alignment assembly 13 may further include a plurality of first laser receiving apparatuses 140, a third guide rail 141 and third slide blocks 142. The number of the first laser receiving apparatuses 140 and the number of the third slide blocks 142 may both be the same as the number of the first laser emitting apparatuses 131. The third guide rail 141 may have a straight-line shape and may be parallel to the first guide rail 132. The third slide blocks 142 may be disposed on the third guide rail 141. The third slide blocks 142 may be configured to be able to slide along the third guide rail 141. Each of the first laser receiving apparatuses 140 may correspond to one of the third slide blocks 142, and may be installed on the corresponding third slide block 142. The positions of the first laser receiving apparatuses 140 may be adjusted along the third guide rail 141.

Each of the first laser receiving apparatuses 140 may correspond to one of the first laser emitting apparatuses 131. By adjusting the positions of the first laser receiving apparatuses 140 to be aligned to the corresponding first laser emitting apparatuses 131, the first laser receiving apparatuses 140 can receive first laser beams 138 emitted by the corresponding first laser emitting apparatuses 131.

Each first laser receiving apparatus 140 may include a plurality of photosensitive sensors (not shown), and the plurality of photosensitive sensors may be sequentially arranged into one column along the direction perpendicular to the support surface 111. The photosensitive sensors may be disposed on a side of each first laser receiving apparatus 140 towards the first laser emitting apparatuses 131. Each of the photosensitive sensors on each first laser receiving apparatus 140 may correspond with one of the first laser beams 138 emitted by the first laser emitting apparatus 131 corresponding to the first laser receiving apparatus 140, and the photosensitive sensors may be configured to be able to receive and sense the corresponding first laser beams 138.

The method for aligning the probe card and the DUT may further include a step S30.

In step S30, the probe card 12 may be moved towards the support surface 111, and whether the probes 122 contact with the bond pads 21 may be determined based on whether the first laser beams 138 are completely blocked by the probes 122.

Upon the completion of the second step of alignment, the probe card 12 may be moved towards the support surface 111 so that the probes 122 contact with the corresponding bond pads 21 of the DUT 2. If the first laser receiving apparatuses 140 still can receive the first laser beams 138, it indicates the probes 122 have not contacted the bond pads 21 and the probe card 12 has not moved to the intended place. Furthermore, the semiconductor tester 1 may send out an alert to a test personnel if the probes 122 have not contacted the bond pads 21. That substantially reduces the time a test personnel otherwise needs to check the contact between the probes and the DUT, thereby improving the test efficiency.

Further, referring to FIG. 12, the alignment assembly 13 may further include a plurality of connection frames 181 and a plurality of seventh linear movement mechanisms 182. The number of the connection frames 181 and the number of the seventh linear movement mechanisms 182 may be the same as the number of the first slide blocks 133. Each of the connection frames 181 may connect to one of the first slide blocks 133 and the third slide block 142 corresponding to the first slide block 133, so that the first laser emitting apparatuses 131 are aligned to the first laser receiving apparatuses 140 corresponding to the first laser emitting apparatuses 131.

Each of the seventh linear movement mechanisms 182 may correspond to one of the connection frames 181, and may be configured to be able to drive the corresponding connection frame 181 to move along the direction parallel to the first guide rail 132. Each of the seventh linear movement mechanisms 182 may include an electric cylinder. Each seventh linear movement mechanism 182 may include a seventh cylinder body 183 and a seventh telescopic rod 184 configured to be able to stretch out or retract into the seventh cylinder body 183.

The seventh telescopic rods 184 may be connected to the connection frames 181 and preferably connected to middle portions of the connection frames 181. When the seventh telescopic rods 184 stretch out of the seventh cylinder bodies 183 or retract into the seventh cylinder bodies 183, the first slide blocks 133 and the third slide blocks 142 can be driven simultaneously to move. Thus, when the positions of the first laser emitting apparatuses 131 are adjusted, the corresponding adjustment can be made to the positions of the corresponding first laser receiving apparatuses 140, so that the first laser beams 138 emitted by the first laser emitting apparatuses 131 can always be received by the first laser receiving apparatuses 140.

The alignment assembly may further include a second laser receiving apparatus (not shown) configured to be able to receive the second laser beams 139. The second laser receiving apparatus and the second laser emitting apparatus 135 may be respectively disposed on two opposite sides of the support platform 11. The second laser receiving apparatus may move along with the second laser emitting apparatus 135, so that the second laser receiving apparatus is always at a position for receiving the second laser beams 139.

Upon the completion of the second step of alignment, the probe card 12 may be moved towards the support surface 111 so that the probes 122 contact with the bond pads 21 of the DUT 2. If the second laser receiving apparatus still can receive the second laser beams 139, it indicates the probes 122 have not contacted the bond pads 21 and the probe card 12 has not moved to the intended place. Furthermore, the semiconductor tester 1 may send out an alert to a test personnel if the probes 122 have not contacted the bond pads 21. That substantially reduces the time a test personnel otherwise needs to check the contact between the probes and the DUT, thereby improving the test efficiency.

In some embodiments, the first linear movement mechanism 151, the second linear movement mechanism 154, the third linear movement mechanism 161, the fourth linear movement mechanism 164, the fifth linear movement mechanism 171, the sixth linear movement mechanism 174, the seventh linear movement mechanism 182 and the ascending-descending mechanism 167 each may include an electric cylinder. It may be understood that the first linear movement mechanism 151, the second linear movement mechanism 154, the third linear movement mechanism 161, the fourth linear movement mechanism 164, the fifth linear movement mechanism 171, the sixth linear movement mechanism 174, the seventh linear movement mechanism 182 and the ascending-descending mechanism 167 may each include other well-known linear movement mechanisms, such as a gear-rack mechanism, an electric push rod, a lead screw, an oil cylinder or a gas cylinder.

It should be understood that the above-described multiple examples may be used along multiple directions (for example, an inclined direction, an upside-down direction, a horizontal direction, a perpendicular direction, etc.) and in multiple structures without departing from principles of the present invention. The embodiments shown in the accompanying drawings merely serve as examples to be illustrated and described for effective applications of the principles of the present invention, and the present invention is not limited to any specific detail of these embodiments.

Certainly, with the careful consideration to the above description on the representative embodiments, it is easily understood by the person skilled in the art that multiple modifications, additions, replacements, deletions and other changes may be made to these detailed embodiments, and these changes are within a scope of the principles of the present invention. Therefore, the foregoing detailed description should be clearly understood as being given merely in descriptive and illustrative manners. The spirit and scope of the present invention are only defined by the appended claims and equivalents.

The invention claimed is:

1. A semiconductor tester, comprising:
   a support platform, comprising a support surface and configured to be able to move along a direction parallel to the support surface and to rotate around a rotating shaft perpendicular to the support surface;
   a probe card, disposed above the support platform and configured to be able to move along a direction parallel to the support surface and a direction perpendicular to the support surface and to rotate around the rotating shaft perpendicular to the support surface, wherein the probe card comprises a plurality of probes stretching towards the support platform; and
   an alignment assembly, comprising:
      at least two first laser emitting apparatuses each emitting a plurality of first laser beams parallel to the support surface of the support platform and positioned higher than the support surface, the plurality of first laser beams from each of the at least two first laser emitting apparatuses being arranged sequentially along the direction perpendicular to the support surface; and
      a second laser emitting apparatus emitting a plurality of second laser beams parallel to the support surface of the support platform and positioned higher than the support surface, the plurality of second laser beams being arranged sequentially along the direction perpendicular to the support surface, and being perpendicular to the first laser beams,
      wherein each of the at least two first laser emitting apparatuses is configured to be able to move along a direction parallel to the second laser beams, and the second laser emitting apparatus is configured to be able to move along a direction parallel to the first laser beams.

2. The semiconductor tester of claim 1, wherein the alignment assembly further comprises:
   a camera; and
   a third laser emitting apparatus, wherein the camera is located on a side of the probe card facing away from the support platform and is configured to be able to move along the direction parallel to the support surface, and the third laser emitting apparatus is installed on the camera,
   and wherein the camera faces towards the support platform, the third laser emitting apparatus is configured to be able to emit a third laser beam towards the support platform, the third laser beam perpendicular to the support surface.

3. The semiconductor tester of claim 1, wherein the probe card further comprises:
   a partially or completely transparent probe seat,
   and wherein the plurality of probes extends from the probe seat and stretch towards the support platform, and at least one of the plurality of probes is installed on a transparent portion of the probe seat.

4. The semiconductor tester of claim 1, wherein the alignment assembly further comprises a plurality of first laser receiving apparatuses, wherein the number of the first laser receiving apparatuses is the same as the number of the first laser emitting apparatuses, with each first laser receiving apparatus arranged corresponding with one of the first laser emitting apparatuses, and the first laser emitting apparatuses and the corresponding first laser receiving apparatuses are respectively located on two sides of the support platform, and wherein the first laser emitting apparatuses are configured to be able to emit the first laser beams to the corresponding first laser receiving apparatuses, and the first laser receiving apparatuses are configured to be able to receive the first laser beams.

5. The semiconductor tester of claim 1, wherein the alignment assembly further comprises a second laser receiving apparatus, wherein the second laser receiving apparatus and the second laser emitting apparatus are respectively disposed on two sides of the support platform, and wherein the second laser emitting apparatus is configured to be able to emit the second laser beams to the second laser receiving apparatus, and the second laser receiving apparatus is configured to be able to receive the second laser beams.

6. The semiconductor tester of claim 1, further comprising:

a platform movement mechanism disposed on a bottom of the support platform, comprising:

a first linear movement mechanism;

a second linear movement mechanism installed on the first linear movement mechanism; and a first rotation movement mechanism, installed on the second linear movement mechanism, the support platform installed on the first rotation movement mechanism, wherein the first linear movement mechanism is configured to be able to drive the second linear movement mechanism to move along the direction parallel to the second laser beams, the second linear movement mechanism is configured to be able to drive the first rotation movement mechanism to move along the direction parallel to the first laser beams, and the first rotation movement mechanism is configured to be able to drive the support platform to rotate around the rotating shaft.

7. The semiconductor tester of claim 6, further comprising a probe movement mechanism disposed on the support platform, wherein the probe movement mechanism comprises:

a third linear movement mechanism;

a fourth linear movement mechanism installed on the third linear movement mechanism;

an ascending-descending mechanism, installed on the fourth linear movement mechanism; and a second rotation movement mechanism, installed on the ascending-descending mechanism, the probe card installed on the second rotation movement mechanism, wherein the third linear movement mechanism is configured to be able to drive the fourth linear movement mechanism to move along the direction parallel to the second laser beams, the fourth linear movement mechanism is configured to be able to drive the ascending-descending mechanism to move along the direction parallel to the first laser beams, the ascending-descending mechanism is configured to be able to drive the rotation movement mechanism to move away from or towards the support surface along the direction perpendicular to the support surface, and the second rotation movement mechanism is configured to be able to drive the probe card to rotate around an axis perpendicular to the support surface.

8. The semiconductor tester of claim 2, wherein the alignment assembly further comprises a camera movement mechanism disposed on the side of the probe card facing away from the support platform, and the camera movement mechanism comprises:

a fifth linear movement mechanism; and a sixth linear movement mechanism, installed on the fifth linear movement mechanism, the camera installed on the sixth linear movement mechanism, wherein the fifth linear movement mechanism is configured to be able to drive the sixth linear movement mechanism to move along the direction parallel to the second laser beams, and the sixth linear movement mechanism is configured to be able to drive the camera to move along the direction parallel to the first laser beams.

9. The semiconductor tester of claim 4, wherein the alignment assembly further comprises:

a first guide rail having a straight-line shape and parallel to the second laser beams;

a plurality of first slide blocks, installed on the first guide rail, and configured to be able to slide along the first guide rail;

a second guide rail having a straight-line shape and parallel to the first laser beams; and a plurality of second slide blocks, installed on the second guide rail, and configured to be able to slide along the second guide rail, wherein each of the first laser emitting apparatuses corresponds to one of the first slide blocks, and is disposed on the corresponding first slide block, each of the second laser emitting apparatuses corresponds to one of the second slide blocks, and is disposed on the corresponding second slide block.

10. The semiconductor tester of claim 9, wherein the alignment assembly further comprises:

a third guide rail having a straight-line shape and parallel to the first guide rail; and a plurality of third slide blocks, installed on the third guide rail, and configured to be able to slide along the third guide rail, wherein the number of the third slide blocks is the same as the number of the first laser receiving apparatuses, with each the third slide block corresponding to one of the first laser receiving apparatuses, and each first laser receiving apparatus installed on the corresponding third slide block.

11. The semiconductor tester of claim 10, wherein the alignment assembly further comprises:

a plurality of connection frames, each connected to one of the first slide blocks and one of the third slide blocks aligned to the first slide block; and a plurality of seventh linear movement mechanisms, each connected with one of the connection frames, and configured to be able to drive the corresponding connection frame to move along a direction parallel to the first guide rail.

12. The semiconductor tester of claim 2, wherein the first laser beams and the second laser beams each have a color different from the color of the third laser beam.

13. A method for calibrating a probe card and a device under testing (DUT), comprising:
- placing the DUT on a support surface;
- providing a plurality of first laser arrays and a second laser array between the DUT and the probe card, each first laser array comprising a plurality of first laser beams, the second laser array comprising a plurality of second laser beams, the first laser beams and the second laser beams being perpendicular to each other and parallel to the support surface, projections of the plurality of first laser beams in a same first laser array on the support surface being overlapped, and projections of the plurality of second laser beams on the support surface being overlapped; and
- aligning, using the first laser beams and the second laser beams as a reference, two probes on the probe card respectively to two bond pads on the DUT.

14. The method of claim 13, wherein aligning two probes on the probe card respectively to two bond pads on the DUT comprises:
- moving the probe card towards the support surface, so that a tip of each of the two probes is located between the first laser beam closest to the support surface and the first laser beam furthest away from the support surface, and is located between the second laser beam closest to the support surface and the second laser beam furthest away from the support surface;
- moving the first laser arrays and the second laser array, so that the first laser beams furthest away from the support surface in two first laser arrays are each respectively blocked by one of the two probes, and a second laser beam furthest away from the support surface in the second laser array is blocked by the two probes; and
- moving the support surface, so that the two bond pads are respectively aligned to first laser beams closest to the support surface in the two first laser arrays, and aligned to the second laser beam closest to the support surface in the second laser array.

15. The method of claim 13, further comprising:
- providing a third laser beam perpendicular to the support surface; and
- aligning, using the third laser beam as a reference, a center of one of the two probes to a center of one of the two bond pads.

16. The method of claim 15, wherein aligning the center of one of the two probes to a center of one of the two bond pads comprises:
- aligning the third laser beam to the center of one of the two probes, and recording a position of the probe card;
- moving away the probe card;
- moving the support surface, so that the center of one of the two bond pads is aligned to the third laser beam; and
- moving the probe card back to the recorded position of the probe card.

17. The method of claim 15, further comprising:
- moving the probe card towards the support surface; and
- determining, based on whether the first laser beams are completely blocked by the probes, whether the probes contact with the bond pads.

* * * * *